(12) United States Patent
Kiyomi et al.

(10) Patent No.: US 10,281,814 B2
(45) Date of Patent: May 7, 2019

(54) SUPPORT FRAME FOR PELLICLE

(71) Applicant: NIPPON LIGHT METAL COMPANY, LTD., Tokyo (JP)

(72) Inventors: Hayato Kiyomi, Shizuoka (JP); Naoto Komura, Shizuoka (JP)

(73) Assignee: NIPPON LIGHT METAL COMPANY, LTD., Tokyo (JP)

(*) Notice: Subject to any disclaimer, the term of this patent is extended or adjusted under 35 U.S.C. 154(b) by 38 days.

(21) Appl. No.: 15/543,942

(22) PCT Filed: Oct. 29, 2015

(86) PCT No.: PCT/JP2015/080518
§ 371 (c)(1),
(2) Date: Jul. 14, 2017

(87) PCT Pub. No.: WO2016/113981
PCT Pub. Date: Jul. 21, 2016

(65) Prior Publication Data
US 2018/0011396 A1   Jan. 11, 2018

(30) Foreign Application Priority Data

Jan. 16, 2015   (JP) .................................. 2015-007022

(51) Int. Cl.
*G03F 1/62*   (2012.01)
*G03F 1/64*   (2012.01)
*H01L 21/027*   (2006.01)

(52) U.S. Cl.
CPC ................. *G03F 1/64* (2013.01); *G03F 1/62* (2013.01); *H01L 21/027* (2013.01)

(58) Field of Classification Search
CPC ...................................... G03F 1/62; G03F 1/64
USPC ............................................................ 430/5
See application file for complete search history.

(56) References Cited

U.S. PATENT DOCUMENTS

| 5,422,704 | A | 6/1995 | Sego |
| 5,729,325 | A | 3/1998 | Kashida |

| 2002/0090558 | A1 | 7/2002 | Shirasaki |
| 2008/0213679 | A1 | 9/2008 | Miyakawa et al. |
| 2010/0330466 | A1 | 12/2010 | Shirasaki et al. |

FOREIGN PATENT DOCUMENTS

| JP | H03-020740 A | 1/1991 |
| JP | 05-002264 A | 1/1993 |
| JP | 9-206723 A | 8/1997 |
| JP | 2001-133961 A | 5/2001 |
| JP | 2002-131892 A | 5/2002 |
| JP | 2002-182373 A | 6/2002 |
| JP | 2004-240221 A | 8/2004 |
| JP | 2005-338722 A | 12/2005 |
| JP | 2006-215487 A | 8/2006 |
| JP | 2010-102357 A | 5/2010 |
| JP | 2011-007934 A | 1/2011 |
| JP | 2011-186327 A | 9/2011 |
| JP | 2013-097308 A | 5/2013 |
| JP | 2013-222143 A | 10/2013 |
| JP | 5454136 B | 3/2014 |
| JP | 5619436 B2 | 11/2014 |
| WO | 2008/105531 A1 | 9/2008 |
| WO | 2015/182483 A1 | 12/2015 |

OTHER PUBLICATIONS

Office Action for Japanese Patent Application No. 2015-007022 (dated Apr. 23, 2018).
International Search Report for PCT/JP2015/080518, dated Jan. 19, 2016.
Office Action for Japanese Patent Application No. 2015-007022, dated Dec. 25, 2018.

*Primary Examiner* — Christopher G Young
(74) *Attorney, Agent, or Firm* — Merchant & Gould P.C.

(57) ABSTRACT

A support frame for a pellicle, in which a pellicle film is adhered to the front surface of an aluminum-alloy frame body, and a transparent substrate is adhered to the rear surface of the frame body. A recessed groove is formed in the rear surface of the frame body, the recessed groove extending along the periphery of the frame body, and a vent hole is formed from the outer peripheral surface of the frame body to the inner surface of the recessed groove. With this configuration, deformation of the support frame can be suppressed when the support frame is removed from the transparent substrate.

8 Claims, 5 Drawing Sheets

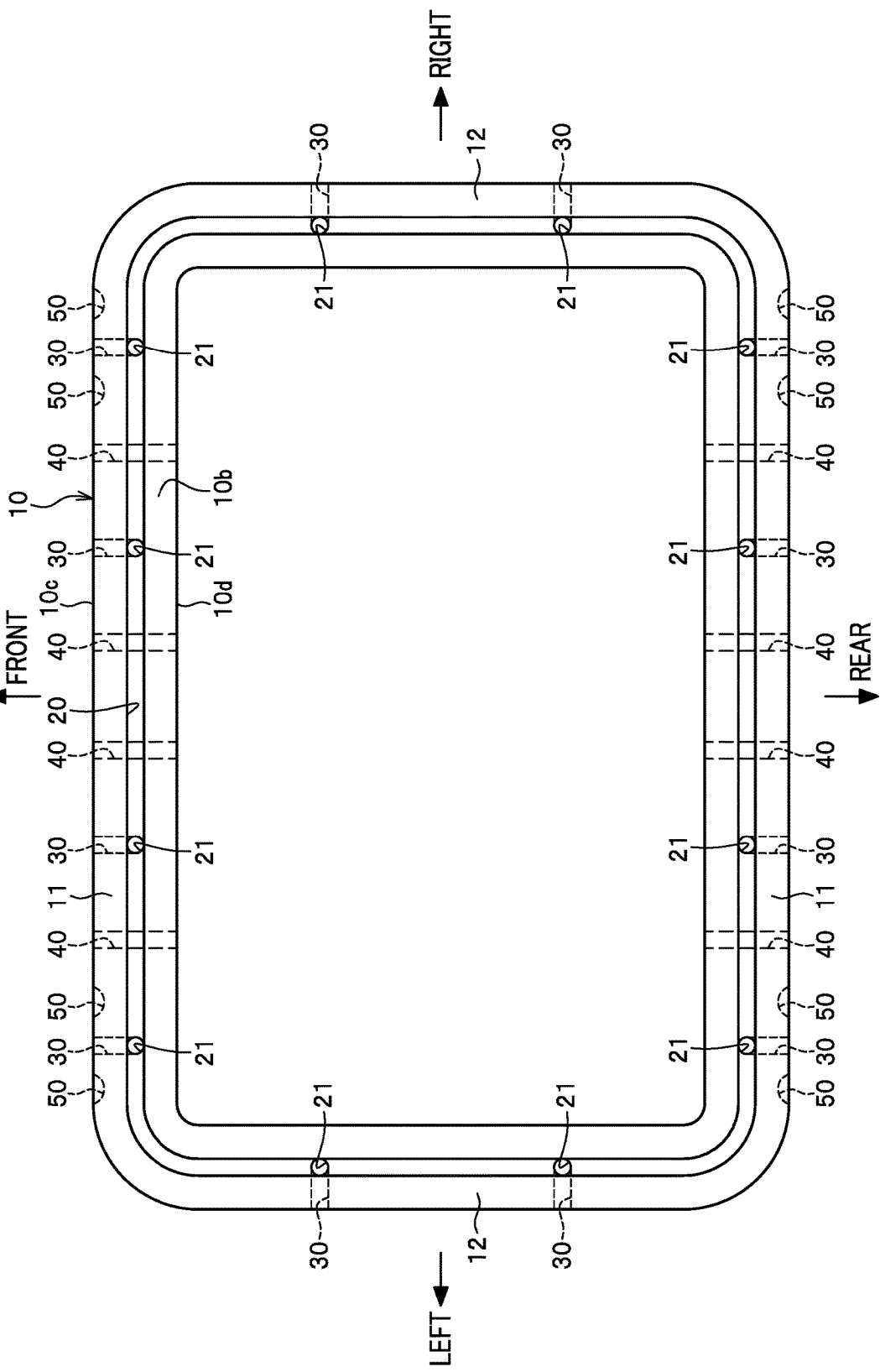

SUPPORT FRAME FOR PELLICLE

CROSS-REFERENCE TO RELATED APPLICATION

This application is a U.S. National Stage Application under 35 U.S.C. § 371 of International Patent Application No. PCT/JP2015/080518 filed Oct. 29, 2015, which claims the benefit of priority to Japanese Patent Application No. 2015-007022, filed Jan. 16, 2015, the disclosures of all of which are hereby incorporated by reference in their entireties.

TECHNICAL FIELD

The present invention relates to a support frame for a pellicle.

BACKGROUND

The process of manufacturing liquid crystal display panels includes a photolithography process for transferring a circuit pattern formed on a transparent substrate such as a photomask or a reticle to a resist applied onto a glass substrate.

If in the photolithography process, a foreign matter such as dust particles are settling on the transparent substrate, the circuit pattern to be transferred onto the resist becomes obscure, therefore the transparent substrate is covered by a pellicle that functions as a dust cover (For example, Patent Document 1).

The pellicle includes a support frame surrounding the entire circuit pattern formed on the transparent substrate, and a translucent pellicle film provided so as to cover a front surface of the support frame. Further, a rear surface of the support frame is adhered to the transparent substrate.

CITATION LIST

Patent Literature 1: Japanese Patent No. 5619436

SUMMARY OF INVENTION

Technical Problem

It is preferable that the pellicle should be reused in view of effective use of resources and reduction in manufacturing cost. Since the support frame has conventionally been separated from the transparent substrate by applying a tensile force to the support frame so that it is likely that the support frame is deformed, making it difficult to reuse the support frame.

It is the object of the present invention to provide the support frame for the pellicle, the support frame being prevented from being deformed when removed from the transparent substrate for solving the foregoing problem.

Solution to Problem

To solve the forgoing problem, the present invention provides a support frame for a pellicle, the support frame having a frame body made of an aluminum-alloy, in which the pellicle film is adhered to a front surface of the frame body, and the transparent substrate is adhered to a rear surface of the frame body. The support frame for the pellicle has a recessed groove extending along the periphery of the frame body formed on the rear surface of the frame body, and has at least one vent hole bored from an outer peripheral surface of the frame body through an inner surface of the recessed groove.

When the support frame of the present invention is removed from the transparent substrate, it is preferable that a pressure inside the recessed groove be increased by supplying air into the recessed grove through the vent holes. Consequently, the increased pressure inside the recessed groove allows the rear surface of the frame body to be readily separated from the transparent substrate. Further, since the recessed groove extends along the periphery of the frame body, it is possible to prevent the pressure from concentrating on a part of the frame body.

Furthermore, it is possible that a dissolving liquid for an adhesive is poured into the recessed groove through the vent holes to dissolve an adhesive layer that adheres the support frame to the transparent substrate, and subsequently a pressure inside the recessed groove is increased so that the support frame is removed from the transparent substrate.

In the present invention as mentioned above, when the support frame is removed from the transparent substrate, the frame body may be pushed in a direction away from the transparent substrate so that deformation of the frame body can be suppressed. This enables the reuse of the support frame.

If the support frame has the recessed groove formed continuously along a whole periphery of the rear surface of the frame body, a uniform pressure is applied to the whole rear surface of the frame body when air is supplied into the recessed groove so that the deformation of the frame body can be suppressed more effectively.

Further, the support frame may have a plurality of the recessed grooves aligned along the periphery of the frame body, and may have at least one of the vent holes communicating with each of the recessed grooves.

If the support frame for the pellicle has the vent hole bored through each side of the frame body, the pressure inside the recessed groove is increased in a well-balance manner so that the deformation of the frame body can be suppressed more effectively.

If the support frame for the pellicle has a bottomed pit formed on a bottom face of the recessed groove and makes the vent hole to open through the inner peripheral surface of the pit, a diameter of the vent hole can be formed larger than a depth of the recessed groove so that an efficiency of supplying air can be increased.

If the support frame for the pellicle has the bottom face of the pit formed on the front surface side of the frame body beyond the vent hole, the bottom face of the pit is disposed beyond the vent hole so as to make the whole axial section of the vent hole to open reliably through the inner peripheral surface of the pit.

It is preferable that the support frame for the pellicle should have the vent hole bored at the center level of the frame body.

In this configuration, it is possible to ensure evenly the thickness from the inner peripheral surface of the vent hole to the front surface of the frame body and the thickness from the inner peripheral surface of the vent hole to the rear surface of the frame body so that the decrease of the flexural rigidity of the frame body can be suppressed.

If the support frame for the pellicle has a through-hole from an outer peripheral surface through the inner surface bored, it is possible to prevent a pressure difference between the interior and the exterior of the support frame after the pellicle film and the transparent substrate are adhered to the support frame.

Advantageous Effects of Invention

By using the support frame for the pellicle of the present invention, the deformation of the frame body can be suppressed when the support frame is removed from the transparent substrate, so that it is possible to reuse the support frame. This will lead to achieve the reduction in manufacturing cost as well as the effective use of resources.

BRIEF DESCRIPTION OF DRAWINGS

FIG. 4 is a schematic bottom view showing the support frame according to the embodiment of the present invention.

DESCRIPTION OF EMBODIMENTS

An embodiment of the present invention will be explained in detail below with reference to the attached drawings as appropriate.

Further, each drawing for the present embodiment shows a part of a support frame schematically as appropriate to explain the structure of the support frame in an easily understandable manner.

In the following explanation, words of front/rear, left/right, and front surface/rear surface are set to explain the structure of the support frame in an easily understandable manner, and are not intended to specify the structure and usage state of the support frame.

Figure 1:
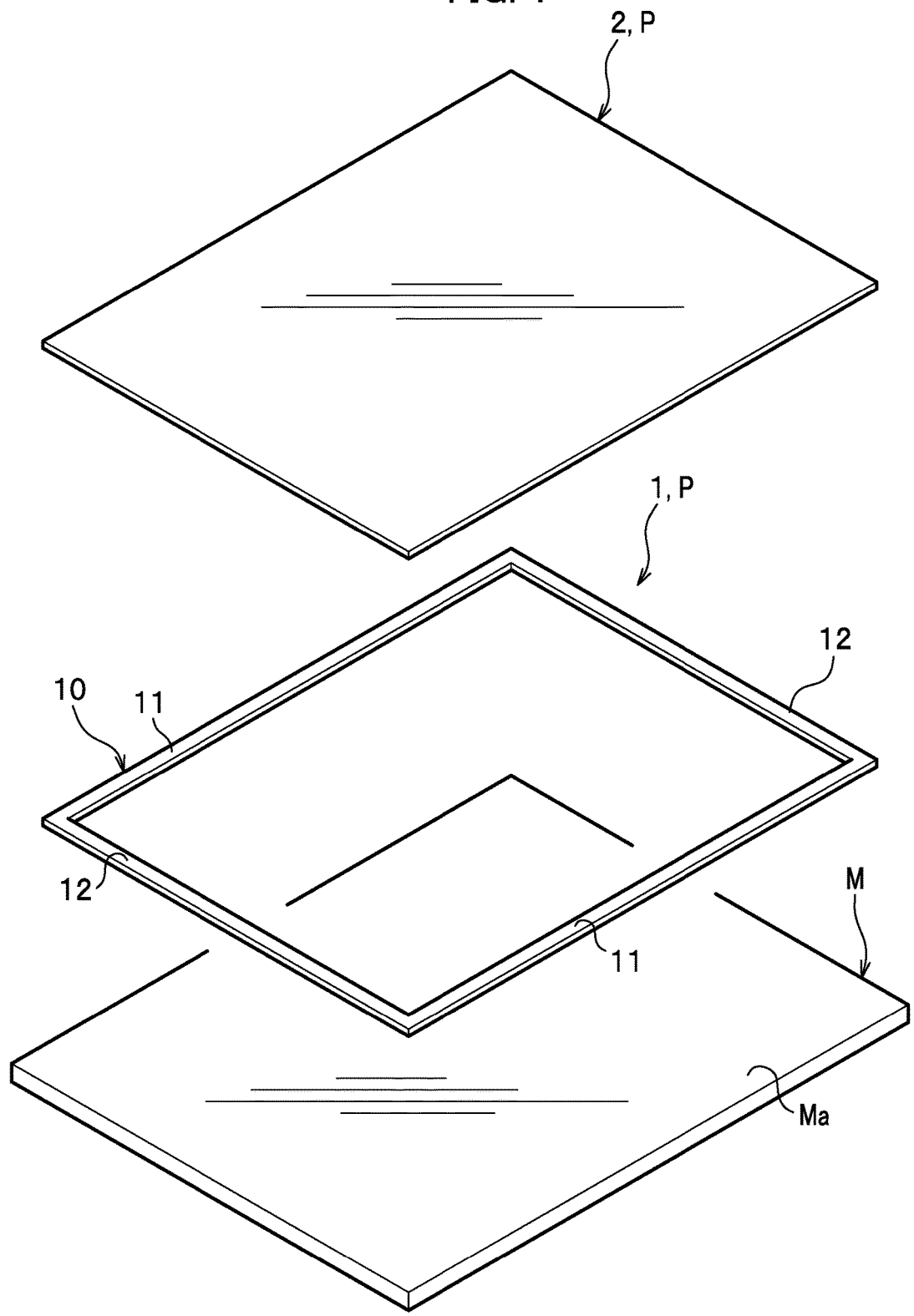
FIG. 1 is a perspective view showing a pellicle and a transparent substrate according to the embodiment of the present invention.

A support frame 1 of the present embodiment is used for a pellicle P as shown in FIG. 1. The pellicle P of the present embodiment serves as a dustproof cover to prevent dust particles or the like from settling on a front surface Ma of a transparent substrate M (photomask) in a photolithographic process in manufacturing liquid crystal display panels.

It is preferable that the pellicle P of the present embodiment should be applied to the manufacture of a large-sized liquid crystal display panel having, for example, a lateral dimension of 700 mm or longer and a longitudinal dimension of 400 mm or longer. The pellicle P includes a support frame 1 that surrounds the entire circuit pattern (not shown) formed on the transparent substrate M and a pellicle film 2 provided so as to cover a front surface of the support frame 1.

The support frame 1 has a frame body 10 having a rectangular shape in a planar view. The frame body 10 is obtained by machining an aluminum-alloy material.

The frame body 10 is composed of a pair of front and rear lateral frame parts 11 and a pair of left and right longitudinal frame parts 12. The axial sections of the lateral frame part 11 and the longitudinal frame part 12 are formed to be in rectangular shapes.

Both of the front and rear lateral frame parts 11 serve as long sides of the frame body 10, while both of the left and right longitudinal frame parts 12 serve as short sides of the frame body 10.

The pellicle 2 is a transparent polymer film such as nitrocellulose, cellulose derivative, and fluoropolymer which are 10 micrometer or smaller. The pellicle 2 is formed to be in a rectangular shape in a planar view, the shape being the same as the outer shape of the support frame 1.

Figure 2:
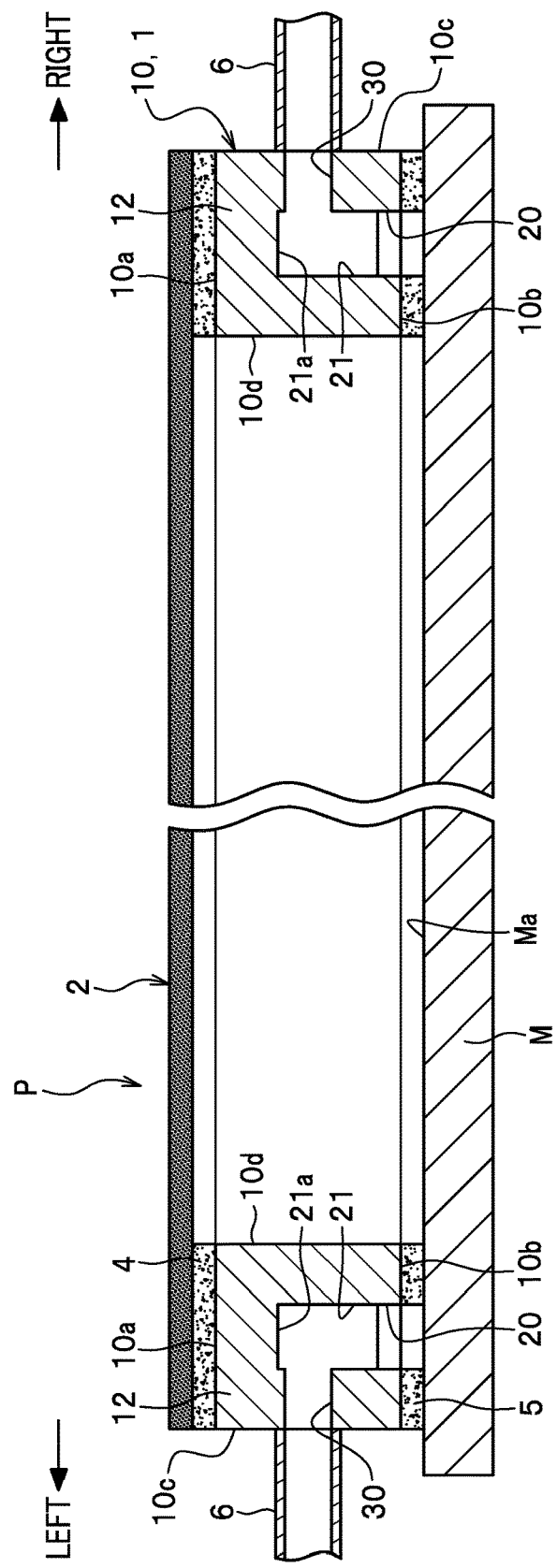
FIG. 2 is a sectional side elevation showing the pellicle and the transparent substrate according to the embodiment of the present invention.

The pellicle 2 is adhered to a front surface 10a of the frame body 10 through an adhesive layer 4 as shown in FIG. 2. When the pellicle 2 is adhered to the front surface 10a of the frame body 10, the whole front surface 10a of the frame body 10 is covered by the pellicle 2.

Further, a rear surface 10b of the frame body 10 has a pressure-sensitive adhesive attached thereto, and the rear surface 10b of the frame body 10 is adhered to the front surface Ma of the transparent substrate M through a pressure-sensitive adhesive layer 5.

The frame body 10 has a recessed groove 20 formed on the rear surface 10b, and has a plurality of vent holes 30 communicating with the recessed groove 20, a plurality of through-holes 40, and a plurality of jig holes 50 bored therethrough as shown in FIG. 4.

The recessed groove 20 extends along a periphery of the frame body 10, and is formed continuously along the whole periphery of the rear surface 10b of the frame body 10. An axial section of the recessed groove 20 is formed to a rectangular shape (See FIG. 5D).

The rear surface 10b of the lateral frame part 11 has the recessed groove 20 formed at the center level in the longitudinal direction (the center in the width direction of the lateral frame part 11), while the rear surface 10b of the longitudinal frame part 12 has the recessed groove 20 formed at the center level in the lateral direction (the center in the width direction of the longitudinal frame part 12).

The rear surface 10b of the lateral frame part 11 has four pits 21 aligned in the lateral direction, and the rear surface 10b of the longitudinal frame part 12 has two pits 21 aligned in the longitudinal direction.

Figure 5A:
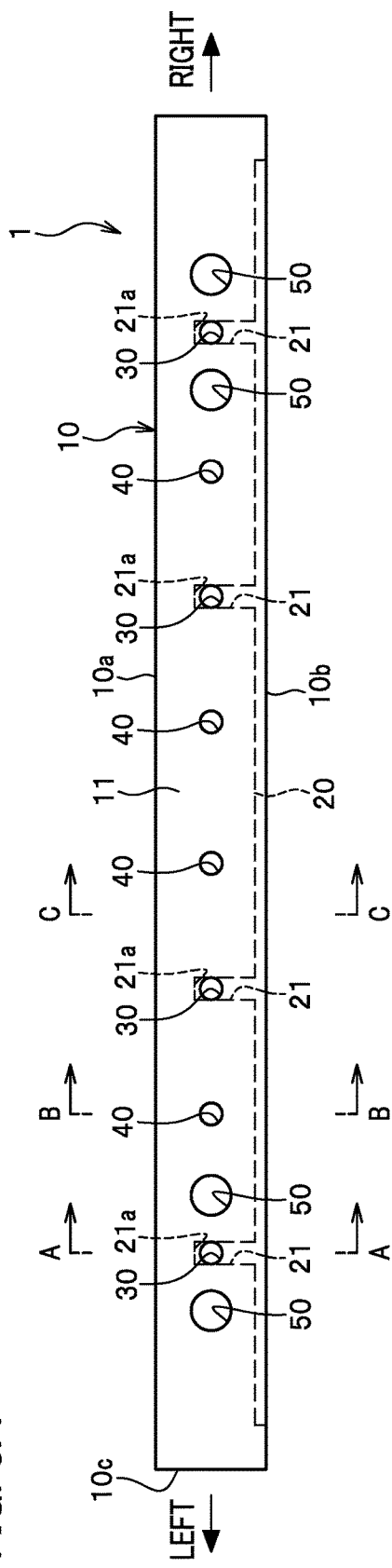
FIG. 5A is a schematic side view showing the support frame according to the embodiment of the present invention.
Figure 5D:
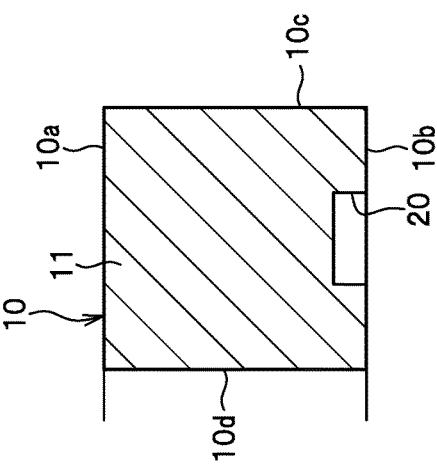
FIG. 5B, FIG. 5C, and FIG. 5D are sectional views showing the support frame taken along lines A-A, B-B, and C-C respectively.

The pit 21 is a bottomed circular hole bored on a bottom face of the recessed groove 20. As shown in FIG. 5B, the bottom face 21a of the pit 21 is disposed on the front surface side of the frame body 10 beyond the center level thereof. In the present embodiment, the bottom face 21a of the pit 21 is disposed on the front surface side of the frame body 10 beyond a vent hole 30 mentioned below.

As shown in FIG. 4, two pits 21 close to the center among the four pits 21 on the lateral frame part 11 are disposed on the right and left sides of the center in the right/left direction (the center in the longitudinal direction) of the lateral frame part 11. Further, two pits 21 close to each of the ends among the four pits 21 on the lateral frame part 11 are disposed on the right and left end parts of the lateral frame part 11.

The two pits 21 on the longitudinal frame part 12 are disposed on the front and rear sides of the center in the back/rear direction (the center in the longitudinal direction) of the longitudinal frame part 12.

The vent hole 30 is a circular hole bored from an outer peripheral surface 10c of the frame body 10 through an inner peripheral surface of the pit 21 as shown in FIG. 5B. The vent hole 30 is disposed at the center level of the frame body 10.

The bottom face 21a of the pit 21 is disposed on the front surface side of the frame body beyond the vent hole 30 so that the whole axial section of the vent hole 30 opens through the inner peripheral surface of the pit 21.

As shown in FIG. 4, each of the front and rear lateral frame parts 11 has four vent holes 30 bored therethrough, and each of the right and left longitudinal frame parts 12 has two vent holes 30 bored therethrough.

As mentioned above, the support frame 1 of the present embodiment has the vent holes 30 bored through each side of the frame body 10. In other words, each side of the recessed groove 20 has a plurality of the vent holes 30 bored therethrough, that is, the recessed groove 20 has twelve vent holes 30 communicating therewith.

Figure 5C:
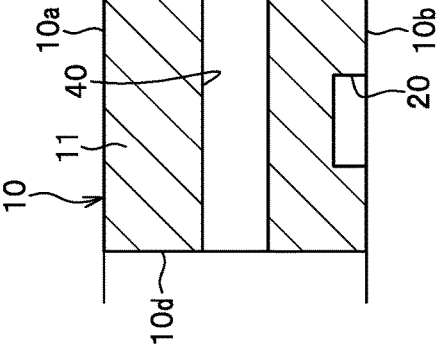
Figure 5B:
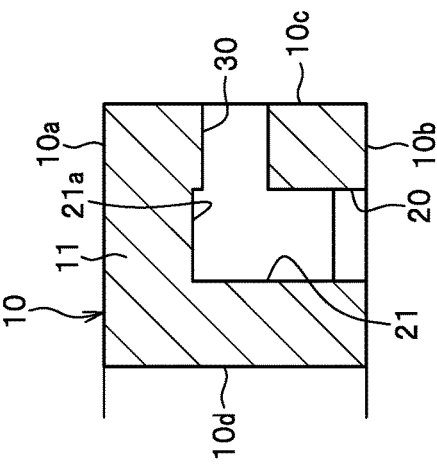

A through-hole 40 is bored from the outer peripheral surface 10c of the lateral frame part 11 of the lateral frame part 11 through an inner peripheral surface 10d of the lateral frame part 11 as shown in FIG. 5C. The through-hole 40 is disposed at the center level of the frame body 10 as shown in FIG. 5A.

Figure 3:
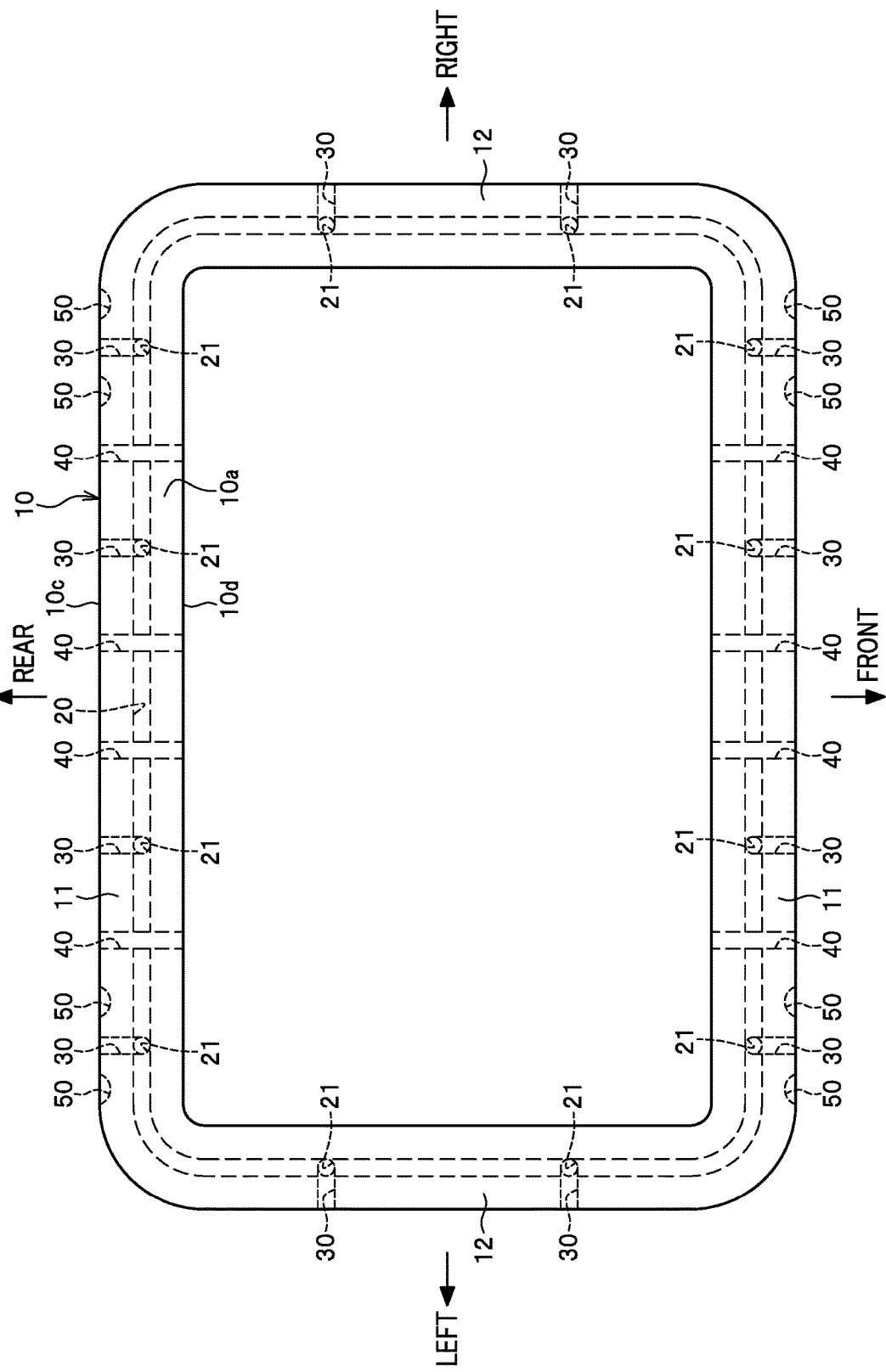
FIG. 3 is a schematic plan view showing a support frame according to the embodiment of the present invention.

As shown in FIG. 3, each of the front and rear lateral frame parts 11 has four through holes 40 bored therethrough. In other words, the frame body 10 has eight through-holes bored therethrough.

Two through-holes 40 and 40 close to the center among the four through-holes 40 in the lateral frame part 11 are aligned between the two pits 21 close to the center among the four pits 21 in the lateral frame part 11.

Further, two through-holes 40 and 40 close to each of the ends among the four through-holes 40 in the lateral frame part 11 are disposed between the two pits 21 adjacent to each other in the left or right area of the lateral frame part 11 among the four pits 21 in the lateral frame part 11.

A jig hole 50 is a bottomed circular hole bored through the outer peripheral surface 10c of the lateral frame part 11 (see FIG. 4). The jig hole 50 has a jig (pin) which serves as a holding device for the support frame 1 in manufacturing the support frame 1 and using the pellicle P inserted therein (see FIG. 1).

Each of the front and rear lateral frame parts 11 has four jig holes 50 bored therethrough. Two jig holes 50 are bored through the right and left sides of an outer vent hole 30 respectively among the four vent holes 30 in the lateral frame part 11.

Since the support frame 1 of the present embodiment has the jig hole 50 bored through the right and left ends of the lateral frame part 11, it is possible to suppress deflection of the lateral frame part 11 when the support frame 1 is held by the jig more than when the jig hole 50 is bored through the center in the right/left direction of the lateral frame part 11.

In the present embodiment, the jig hole 50 is disposed at the center level of the frame body 10 as shown in FIG. 5A, however the level at which the jig hole 50 is disposed is not limited, and the level position and shape of the jig hole 50 are set depending on what type of jig is used.

The pellicle P of the present embodiment has the pellicle film 2 adhered to the front surface 10a of the frame body 10 through the adhesive layer 4 as shown in FIG. 2. Further, the rear surface 10b of the frame body 10 is adhered to the transparent substrate M through the pressure-sensitive adhesive layer 5.

When the pellicle P is adhered to the transparent substrate M, the support frame 1 is interposed between the pellicle film 2 and the transparent substrate M, so that the pellicle film 2 is disposed spaced apart from the front surface Ma of the transparent substrate M.

Further, the pellicle P has the through-hole 40 (see FIG. 3) bored through the frame body 10 of the support frame 1. Thus, even with the front and rear surfaces of the frame body 10 covered by the pellicle film 2 and the transparent substrate M, the interior of the frame body 10 is in communication with the exterior of the frame body 10 through the through-hole 40, so that it is possible to prevent a pressure of the interior of the frame body 10 from being different from a pressure of the exterior of the frame body 10.

The procedure of removing the pellicle P from the transparent substrate M will be explained below.

A dissolving liquid for an adhesive is poured into the recessed groove through each of the vent holes 30 with the pellicle P adhered to the transparent substrate M as shown in FIG. 2 so as to dissolve the pressure-sensitive adhesive layer 5.

Then, the aperture of the vent hole 30 has the tip part of a vent pipe 6 connected therewith on the side of the outer peripheral surface 10c of the frame body 10. In this configuration, each of the vent pipes 6 is coupled to an air supplying device not shown.

When air is supplied by the air supplying device into the recessed groove 20 through each of the vent holes 30, the pressure inside the recessed groove 20 is increased. Consequently, the increased pressure inside the recessed groove 20 pushes the frame body 10 in a direction separating from the transparent substrate M so as to peel off and remove the pellicle P from the transparent substrate M.

Further, when the pellicle film 2 and the transparent substrate M are adhered to the support frame 1 as shown in FIG. 2, the transparent substrate M is stacked on the rear surface 10b of the frame body 10 through the pressure-sensitive adhesive layer 5 after the pellicle P is formed by having the pellicle film 2 adhered to the front surface 10a of the frame body 10.

In the support frame 1 as mentioned above, the air is supplied into the recessed groove 20 from each of the vent holes 30 as shown in FIG. 2 so that the pressure inside the recessed groove 20 is increased, so that it becomes easy to separate the rear surface 10b of the frame body 10 from the transparent substrate M.

Consequently, when the support frame 1 is removed from the transparent substrate M, deformation of the frame body 10 can be suppressed. As a result, the support frame 1 can be reused.

Further, since the support frame 1 can be used repeatedly, it is possible to reduce a manufacturing cost of liquid crystal display panels as well as to use resources effectively.

As shown in FIG. 4, the support frame 1 has the recessed groove 20 formed continuously along the whole periphery of the rear surface 10b of the frame body and has the vent hole 30 bored through each side of the frame body 10.

Therefore, when the air is supplied into the recessed groove, a uniform pressure is applied to the whole rear surface 10b of the frame body 10 to increase the pressure inside the recessed groove in a well-balance manner, so that it is possible to suppress the deformation of the frame body more effectively.

The support frame 1 has the vent hole opening through the inner peripheral surface of the pit 21 as shown in FIG. 5B, so that the vent hole can be formed to have a larger diameter than a depth of the recessed groove, resulting in an increased efficiency of supplying air.

The support frame 1 has the bottom face 21a of the pit 21 disposed beyond the vent hole (on the front surface side) so as to have the whole axial section of the vent hole 30 opening through the inner peripheral surface of the pit 21 reliably.

As shown in FIG. 5A, the support frame 1 has each of the vent holes 30 formed at the center level of the frame body 10. This configuration makes it possible to ensure evenly the thickness from the inner peripheral surface of the vent hole 30 to the front surface 10a of the frame body 10 and the thickness from the inner peripheral surface of the vent hole 30 to the rear surface 10b of the frame body 10 so that the decrease of the flexural rigidity of the frame body 10 can be suppressed.

The embodiment of the present invention has been explained as above, however the present invention is not limited to the above-mentioned embodiment, and can be altered as appropriate within the scope of the significance.

Though in the present embodiment the recessed groove 20 is formed continuously along the whole periphery of the frame body 10 as shown in FIG. 4, it is possible to have a plurality of the recessed grooves 20 which run in parallel with each other along the periphery of the frame body 10 and have the vent hole 30 communicating with each of the recessed grooves 20.

Further, the number and disposition of the vent hole 30 and the through-hole 40 are not limited, and set properly according to the size of the frame body 10.

Furthermore, though in the present embodiment the vent hole 30, the through-hole 40, and the jig hole 50 are formed at the center level of the frame body 10 as shown in FIG. 5A, it is possible to have them formed at a position off the center level of the frame body 10.

REFERENCE SIGNS LIST

1 Support frame
2 Pellicle film
4 Adhesive layer
5 Pressure-sensitive adhesive layer
6 Vent pipe
10 Frame body
10a Front surface
10b Rear surface
10c Outer peripheral surface
10d Inner peripheral surface
11 Lateral frame body
12 Longitudinal frame body
20 Recessed groove
21 Pit
21a Bottom face
30 Vent hole
40 Through-hole
50 Jig hole
M Transparent substrate
P Pellicle

What is claimed is:

1. A support frame for a pellicle, comprising:
   a frame body made of an aluminum-alloy, and adapted to allow a pellicle film to be adhered to a front surface thereof, and to allow a transparent substrate to be adhered to a rear surface thereof, wherein
   the rear surface of the frame body has a recessed groove which extends along a periphery of the frame body formed, and each side of the frame body has vent holes bored from an outer peripheral surface thereof through an inner surface of the recessed groove.

2. The support frame for the pellicle according to claim 1, wherein
   the vent holes are disposed on both sides of a middle in a longitudinal direction of each side of the frame body.

3. The support frame for the pellicle according to claim 1, wherein
   a bottom face of the recessed groove has bottomed pits bored therethrough such that the vent holes open through an inner peripheral surface of the bottomed pits.

4. The support frame for the pellicle according to claim 3, wherein
   a bottom face of the bottomed pit is formed on a front surface side of the frame body beyond the vent hole.

5. The support frame for the pellicle according to claim 1, wherein
   the vent hole is bored at a center level of the frame body.

6. The support frame for the pellicle according to claim 1, wherein
   the frame body has a through-hole bored from an outer peripheral surface through an inner peripheral surface.

7. The support frame for the pellicle according to claim 1, wherein
   a plurality of the recessed grooves are aligned along the periphery of the frame body, and each of the recessed grooves has at least one of the vent holes communicating therewith.

8. The support frame for the pellicle according to claim 1, wherein the vent holes are configured to communicate air supplied to the vent holes into the recessed groove so that a pressure inside the recessed groove is increased.

* * * * *